United States Patent
Murai et al.

(10) Patent No.: US 6,492,593 B2
(45) Date of Patent: Dec. 10, 2002

(54) GOLD WIRE FOR SEMICONDUCTOR ELEMENT CONNECTION AND SEMICONDUCTOR ELEMENT CONNECTION METHOD

(75) Inventors: Hiroshi Murai, Mitaka (JP); Shuichi Mitoma, Mitaka (JP); Takeshi Tokuyama, Mitaka (JP); Mitutomo Motomura, Saga (JP)

(73) Assignee: Tanaka Denshi Kogyo K.K., Tokyo (JP)

( * ) Notice: Subject to any disclaimer, the term of this patent is extended or adjusted under 35 U.S.C. 154(b) by 0 days.

(21) Appl. No.: 09/872,651

(22) Filed: May 31, 2001

(65) Prior Publication Data

US 2002/0007957 A1 Jan. 24, 2002

(30) Foreign Application Priority Data

May 31, 2000  (JP) ........................................ 2000-166524

(51) Int. Cl.[7] ................................................. H01R 4/00
(52) U.S. Cl. ..................... 174/94 R; 420/507; 428/620
(58) Field of Search ............................ 174/74 R, 84 R, 174/94 R, 36; 428/606, 364; 420/507, 510, 511; 219/137 PS; 148/430

(56) References Cited

U.S. PATENT DOCUMENTS

| | | | | |
|---|---|---|---|---|
| 4,080,485 A | * | 3/1978 | Bonkohara | 428/620 |
| 4,885,135 A | | 12/1989 | Hosoda et al. | 420/507 |
| 4,938,923 A | * | 7/1990 | Kujiraoka et al. | 420/509 |
| 4,950,866 A | * | 8/1990 | Kojima et al. | 219/137 PS |
| 4,970,365 A | * | 11/1990 | Chalco | 219/121.63 |
| 5,384,090 A | * | 1/1995 | Ogashiwa | 420/555 |
| 5,842,628 A | * | 12/1998 | Nomoto et al. | 228/180.5 |
| 5,945,065 A | * | 8/1999 | Kikuchi et al. | 420/507 |
| 5,989,364 A | * | 11/1999 | Kitamura | 148/430 |
| 6,239,376 B1 | * | 5/2001 | Kimura et al. | 174/110 R |

FOREIGN PATENT DOCUMENTS

| | | | |
|---|---|---|---|
| EP | 0 685 565 | 12/1995 | |
| EP | 0 810 293 | 12/1997 | |
| GB | 2 262 944 | 7/1993 | |
| JP | 2-170931 | 7/1990 | |
| JP | 2-205651 | 8/1990 | |
| JP | 5-343461 A | * 12/1993 | H01L/21/60 |
| JP | 10-083716 | 3/1998 | |
| JP | 10-172998 | * 6/1998 | H01L/21/60 |
| JP | 10-303239 | 11/1998 | |
| JP | 11-126788 | * 5/1999 | H01L/21/60 |
| JP | 11-163016 | 6/1999 | |
| JP | 2000-144282 | 5/2000 | |

OTHER PUBLICATIONS

European Search Report, dated Oct. 9, 2001.

* cited by examiner

*Primary Examiner*—Dean A. Reichard
*Assistant Examiner*—William H. Mayo, III
(74) *Attorney, Agent, or Firm*—Christie, Parker & Hale, LLP

(57) ABSTRACT

A gold wire, for semiconductor element connection, having 5–100 ppm by weight of Ca, 5–100 ppm by weight of Gd, and 1–100 ppm by weight of Y. The gold wire further preferably has 1–100 ppm by weight of at least one of Eu, La, Ce and Lu, as well as 1–100 ppm by weight of at least one of Mg and Ti. The total amount of the added elements being no greater than 200 ppm by weight. The balance being gold and unavoidable impurities. A semiconductor element connection method by ball bonding or bump connection using the gold wire.

12 Claims, 3 Drawing Sheets

GOLD WIRE FOR SEMICONDUCTOR ELEMENT CONNECTION AND SEMICONDUCTOR ELEMENT CONNECTION METHOD

CROSS-REFERENCE TO RELATED APPLICATION

This application claims priority of Japanese patent Application No. 2000-166524, filed on May 31, 2000.

BACKGROUND OF THE INVENTION

1. Field of the Invention

The present invention relates to a gold wire for semiconductor element connection, used for electrical connection of external leads and the like to electrodes on semiconductor elements. Specifically, it relates to a gold wire for semiconductor element connection suitable for narrow pitch connections and thin electrode connections.

2. Description of the Related Art

Among the common methods of connecting external leads to semiconductor element electrodes, during mounting of semiconductor devices, are wiring methods such as ball bonding using gold wire, and methods of using gold wire to form bumps for connection through the bumps.

In wiring methods involving ball bonding, the gold wire is fed out and introduced into a capillary used as the bonding tool and then, after forming a ball at the tip of a fine metal wire projected from the opening of the tool, the ball is pressed against an Al electrode of the semiconductor element and the capillary is moved in the X, Y and Z directions (back and forth, left and right, up and down) to form a prescribed loop shape; after bonding to the external lead, the metal fine wire is then cut to accomplish wire bonding (this will hereunder be referred to as "ball bonding").

In methods of forming connections through bumps, the ball is pressed against the Al electrode of the semiconductor element and then the gold wire is cut near the ball attachment base, to form a connection through the ball (this will hereunder be referred to as "bump connection").

With the higher performance and size reduction of semiconductor devices in recent years, advances are being made in reducing pitches due to the increase in pin numbers of semiconductor elements. This has raised the level of performance demanded of gold wires and, because the outer diameter of the press bonded balls obtained by pressing the balls is about twice the diameter of the wire, one of the important properties of performance required is to improve the roundness or circularity of the press bonded balls.

It has been attempted in the past to control the roundness of the ball before press bonding during their formation. However, in recent years it has been found that the roundness of press-bonded balls which are suited for narrow pitch connections does not necessarily match the roundness of the non-press-bonded balls.

Preliminary attempts to improve the roundness of press-bonded balls have therefore been proposed. For example, Japanese Unexamined Patent Publication HEI No. 11-163016 discloses adding at least one from among Cu, Pt and Pd in a total of 0.03–5 wt %, Japanese Unexamined Patent Publication HEI No. 10-172998 discloses adding Be and Ca, and Japanese Unexamined Patent Publications HEI No. 10-303239 and HEI No. 10-83716 disclose adding Ca or the like in addition to Mn and Pd.

For narrow pitch wiring, however, the balls used for press bonding are more minute than conventional balls, and their roundness must be maintained after press bonding for smaller press bonded sizes. Among the techniques mentioned above, the disclosure of Japanese Unexamined Patent Publication HEI No. 10-172998 has a drawback in that minute balls have insufficient press bonded roundness, or the prescribed wire strength cannot be achieved. With narrow pitch connections in wiring bonding, it is particularly important to improve the wire strength to prevent contact shorts due to wire failure.

The other techniques also have drawbacks, such as insufficient press bonded roundness of minute balls, or high electrical resistance as a result of the vastly increased contents of elements added to improve the roundness.

In addition, with the demand for thin-film Al electrodes in schematic elements, and thinner sizes of these electrodes, electrode breakage occurs, due to the press bonded balls, particularly in the case of bump connections, thus leading to the problem of semiconductor element, or IC, chip cracking (hereunder referred to as "chip cracking"). The drastic increase in the content of added elements as mentioned above is also implicated in the problem of chip cracking.

Furthermore, when a connection is established by a bump, a method is adopted wherein the gold wire is pulled upward after the ball has been pressed onto the Al electrode of the semiconductor element, to cause a break near the base of the ball. Here, it is necessary to achieve a uniform length for the remaining wires attached to the press bonded balls (hereunder referred to as "tail length").

It is an object of the present invention, which has been accomplished in light of these circumstances of the prior art, to provide a gold wire for semiconductor element connection which has a specific gold alloy composition with an added element content of no greater than 200 ppm by weight in order to minimize increase in electrical resistance, and which improves the roundness after press bonding of minute balls, exhibits high wire strength, produces no problem of chip cracking due to the press bonded balls even in the case of a small Al electrode film thickness on a semiconductor element, and gives a uniform tail length for bump connections.

DISCLOSURE OF THE INVENTION

The present invention provides the following in order to achieve the aforementioned objects.

(1) A gold wire for semiconductor element connection consisting of 5–100 ppm by weight of Ca, 5–100 ppm by weight of Gd and 1–100 ppm by weight of Y, the total amount of these elements being no greater than 200 ppm by weight, the balance being gold and unavoidable impurities.

(2) The gold wire for semiconductor element connection according to (1) above, which further consists of 1–100 ppm by weight of at least one from among Mg, Ti and Pb, the total amount of the added elements being no greater than 200 ppm by weight.

(3) A gold wire for semiconductor element connection consisting of 5–100 ppm by weight of Ca, 5–100 ppm by weight of Gd, 1–100 ppm by weight of Y, and 1–100 ppm by weight of at least one from among rare earth elements other than Gd and Y, the total amount of these elements being no greater than 200 ppm by weight, the balance being gold and unavoidable impurities.

(4) The gold wire for semiconductor element connection according to (3) above, which further consists of 1–100 ppm by weight of at least one from among Mg, Ti and Pb, the total amount of the added elements being no greater than 200 ppm by weight.

(5) A semiconductor element connection method which comprises
  (A) a step of inserting a gold wire into a capillary, and heating and melting the tip of the gold wire to form a gold ball,
  (B) a step of lowering the capillary and pressing the gold ball against an electrode of the semiconductor element to bond the gold wire to the electrode,
  (C) a step of tracing a prescribed path with the capillary including the gold wire bonded to the electrode, to move it over a member to be connected and establish a press bond between the side of the gold wire and the member to be connected, and
  (D) a step of raising the gold wire which has been press bonded to the connection member while clamping it with a damper to cut the gold wire, to complete wiring of the gold wire between the semiconductor element electrode and the connection member, wherein the gold wire is a gold wire according to any one of (1) to (4) above.
(6) The method of (5) above, wherein step (A) and/or step (C) further includes transmitting ultrasonic vibrations through the capillary to the gold wire tip while heating the semiconductor element or connection member with a heater block for thermocompression bonding of the gold ball.
(7) The method of (5) or (6) above, wherein the pitch of the adjacent electrodes on the semiconductor element is no greater than 70 μm.
(8) The method of (5) or (6) above, wherein the pitch of the adjacent electrodes on the semiconductor element is no greater than 60 μm.
(9) A semiconductor element connection method which comprises
  (A) a step of inserting a gold wire into a capillary, and heating and melting the tip of the gold wire to form a gold ball,
  (B) a step of lowering the capillary and pressing the gold ball against an electrode of the semiconductor element to form a press bonded gold ball, and
  (C) a step of raising the gold wire which has the formed press bonded gold ball on the semiconductor element electrode while clamping it with a damper to cut the gold wire near the base of the press bonded gold ball, to form a bump on the electrode, wherein the gold wire is a gold wire according to any one of (1) to (4) above.
(10) The method of (9) above, which further comprises a step of press bonding the bump formed on the semiconductor element electrode to a member to be connected.
(11) The method of (9) or (10) above, wherein step (A) further includes transmitting ultrasonic vibrations through the capillary to the gold wire tip while heating the semiconductor element with a heater block for thermocompression bonding of the gold ball.
(12) The method of any one of (9) to (11) above, wherein the semiconductor element electrode is an aluminum electrode film with a film thickness of no greater than 0.5 μm.
(13) The method of any one of (9) to (11) above, wherein the semiconductor element electrode is an aluminum electrode film with a film thickness of no greater than 0.1 μm.

Figure 1A:
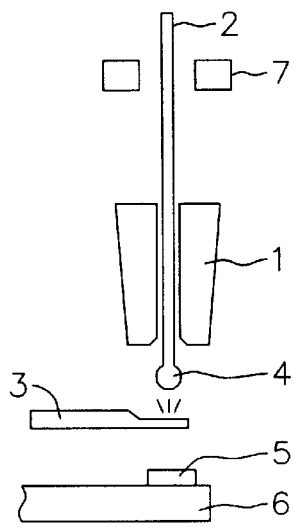
FIGS. 1A–1D are step diagrams illustrating a wiring bonding method by ball bonding.

DETAILED DESCRIPTION OF THE INVENTION (1) Composition

[1] Gold starting material

The gold starting material used is preferably high purity gold purified to at least 99.99 wt %. It is more preferably at least 99.995 wt % and even more preferably at least 99.999 wt %. Higher purity gold is preferred because it allows greater elimination of the effects of harmful components.

[2] [Ca]

In the copresence of the prescribed amounts of Gd and Y in the gold alloy wire used for the invention, a Ca content of 5–100 ppm by weight can achieve the object stated above.

If the Ca content is within this range, the roundness of the press bonded minute ball and the breaking strength are improved and the tail length uniformity during bump formation is improved, as compared with a Ca content of less than 5 ppm by weight. Also, the minute ball press bonded roundness is improved and chip cracking with thin-film electrodes is reduced, as compared with a Ca content of greater than 100 ppm by weight. Thus, the Ca content is 5–100 ppm by weight in the copresence of the prescribed amounts of Gd and Y.

[3] [Gd]

In the copresence of the prescribed amounts of Ca and Y in the gold alloy wire used for the invention, a Gd content of 5–100 ppm by weight can achieve the object stated above.

If the Gd content is within this range, the minute ball press bonded roundness is improved and the tail length uniformity during bump formation is improved, as compared with a Gd content of less than 5 ppm by weight. Also, the minute ball press bonded roundness is improved and chip cracking with thin-film electrodes is reduced, as compared with a Gd content of greater than 100 ppm by weight. Thus, the Gd content is 5–100 ppm by weight in the copresence of the prescribed amounts of Ca and Y.

[4] [Y]

In the copresence of the prescribed amounts of Ca and Gd in the gold alloy wire used for the invention, a Y content of 1–100 ppm by weight can achieve the object stated above.

If the Y content is within this range, the minute ball press bonded roundness is improved and the tail length uniformity during bump formation is improved, as compared with a Y content of less than 1 ppm by weight. Also, the minute ball press bonded roundness is improved and chip cracking with thin-film electrodes is reduced, as compared with a Y content of greater than 100 ppm by weight. Thus, the Y content is 1–100 ppm by weight in the copresence of the prescribed amounts of Ca and Gd.

[5] [Rare earth elements other than Gd, Y] (hereunder referred to as "first group elements")

Addition of 1–100 ppm by weight of at least one first group element in the copresence of the prescribed amounts of Ca, Gd and Y in the gold alloy wire used for the invention is preferred to further improve the minute ball press bonded roundness and tail length uniformity during bump formation, as compared with no addition. Eu, La, Ce and Lu are preferably used among the first group elements.

It is therefore preferred to add 1–100 ppm by weight of at least one first group element in the copresence of the prescribed amounts of Ca, Gd and Y.

[6] [Mg, Ti, Pb] (hereunder referred to as "second group elements")

Addition of 1–100 ppm by weight of at least one second group element in the copresence of the prescribed amounts of Ca, Gd and Y or in the copresence of the added prescribed amounts of first group elements in the gold alloy wire used for the invention will give a performance equivalent to that with no addition. Mg, Ti and Pb are preferably used among the second group elements.

[7] Total added amount

If the total added amount in the gold alloy wire used for the invention exceeds 200 ppm by weight, chip cracking with thin-film electrodes can occur. It is also undesirable because of the increased electrical resistance. The total amount of added elements must be no greater than 200 ppm by weight.

(2) Gold Wire Fabrication Steps

An example of fabrication steps for a semiconductor element gold wire according to the invention will now be explained. After first melting the prescribed composition of metals and casting it into an ingot, a groove type rolling machine is used for rolling with intermediate annealing to make a fine wire with a diameter of 10–100 $\mu$m by final cold working, after which a final annealing is performed to an elongation of 4–6%, and the wire surface is coated with a lubricating rust preventer. Finally, the wire that has completed these working steps is usually wound to a prescribed length onto a 50.3 mm outer diameter spool at a prescribed tension to complete the product. The prescribed length may be 100–3000 m, and longer lengths are also becoming common.

(3) Uses

The gold wire of the invention is used for connection between semiconductor element electrodes and external leads (or wiring boards), and the connection method is commonly a method of wiring and bonding by ball bonding, or a method of forming a bump with gold wire and then establishing connection through the bump. These methods are illustrated in FIGS. 1 to 4.

[1] Method of Connection by Ball Bonding

As shown in FIG. 1A, the gold wire 2 is passed through a capillary 1, an electric torch 3 is placed facing its tip and an electric discharge is provided between it and the gold wire 2 to heat the tip of the gold wire 2, fusing it to form a ball 4.

Figure 1B:
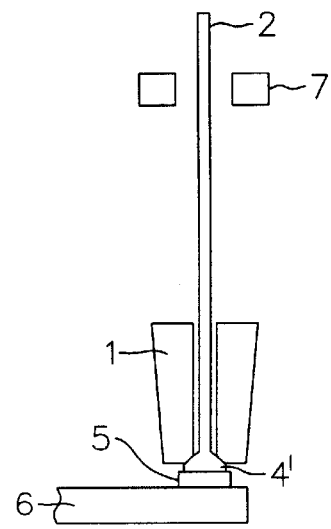

Next, as shown in FIG. 1B, the capillary 1 is lowered for press bonding the ball 4 onto an Al electrode 5 on the semiconductor element 6. Here, ultrasonic vibrations (not shown) are passed through the capillary 1 and applied thereto while the semiconductor element 6 is heated with a heater block, so that the ball 4 is thermocompression bonded, becoming a press bonded ball 4'.

Figure 1C:
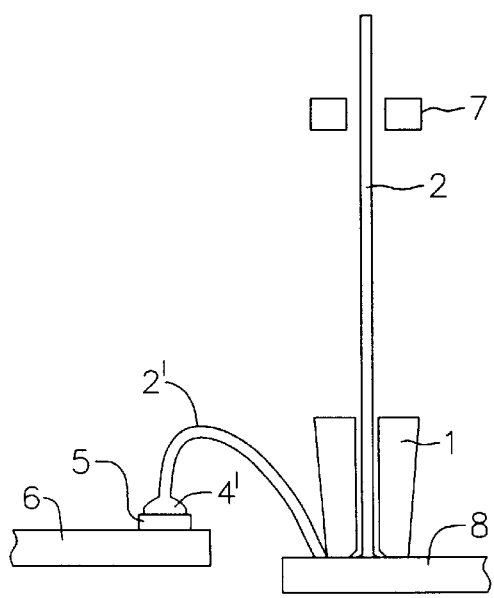

Next, as shown in FIG. 1C, the capillary 1 is moved and lowered onto an external lead 8 tracing a prescribed path. Ultrasonic vibrations (not shown) are passed through the capillary 1 and applied thereto while the external lead 8 is heated with a heater block, so that the side of the gold wire 2 is thermocompression bonded to the external lead 8.

Figure 1D:
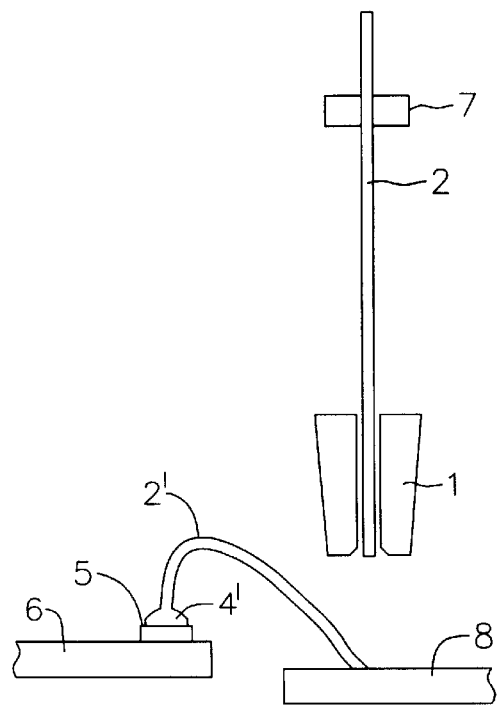

Finally, as shown in FIG. 1D, the clamper 7 is raised while clamping the gold wire 2, thus cutting the gold wire 2 and completing the wiring. The wiring section is then sealed with a resin to complete the semiconductor device. The semiconductor device may be a resin-sealed type or a ceramic package type, and is not particularly restricted. Thus, various leads or electrodes may be on the electrode or wiring side of the semiconductor device.

Here, the distance between the centers of the press bonded balls 4' (hereunder referred to as "pitch spacing") must be a narrow pitch of no greater than 70 $\mu$m and especially no greater than 60 $\mu$m, in comparison with the conventional pitch of about 80 $\mu$m.

The gold wire of the invention has high strength and gives improved roundness for press bonded balls and, therefore, in semiconductor devices wherein the semiconductor element electrode and lead section have a wiring connection formed with a gold wire and the wiring section is sealed with a resin, the pitch spacing of the semiconductor device is preferably no greater than 70 $\mu$m.

[2] Method of Connection Through a Bump

Figure 2A:
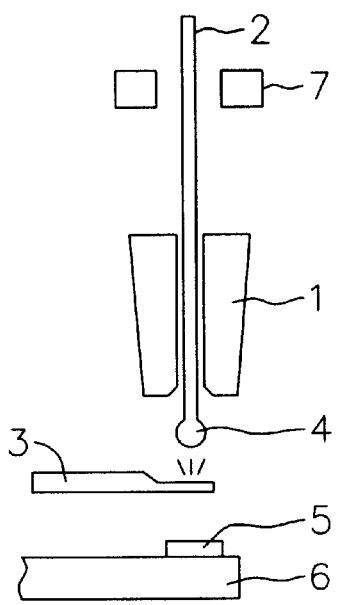
FIGS. 2A–2D are step diagrams illustrating a bump connection method.
Figure 2B:
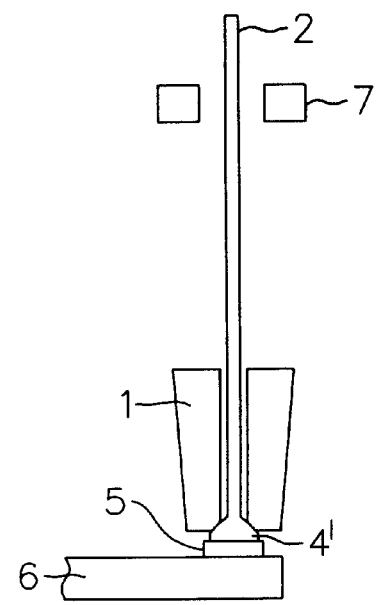

A press bonded ball 4' is formed by pressing and bonding the ball 4 onto the Al electrode 5 on the semiconductor element 6 by the same method as shown in FIG. 1A and FIG. 1B (see FIG. 2A and FIG. 2B).

Figure 2C:
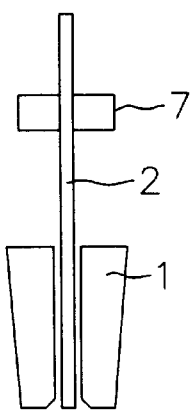
Figure 2C:
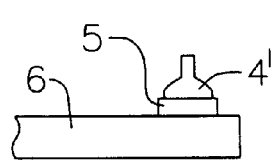

Next, as shown in FIG. 2C, a clamper 7 clamping the gold wire 2 is moved upward while the semiconductor element 6 is anchored, so that the gold wire 2 is cut leaving the wire tail section near the base of the press bonded ball 4'. The gold wire 2 is affected by the heat during the ball formation such that the area near the base of the ball is fragile, and therefore pulling the gold wire in the manner described above cuts it near the base of the ball.

Figure 2D:
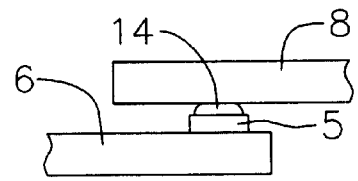
Figure 3A:
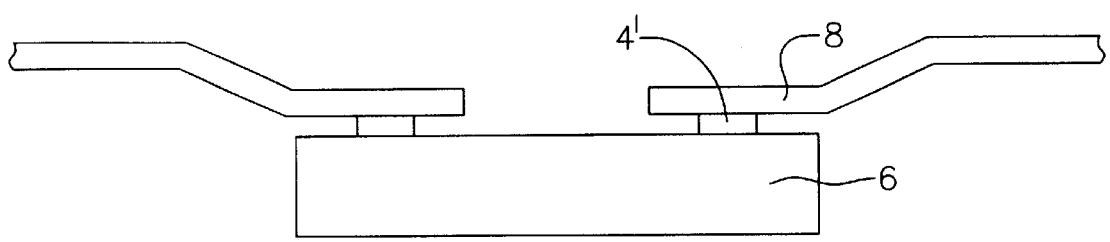
FIGS. 3A and 3B are illustrations showing connections between a semiconductor element and leads or a wiring board formed by bump connection.
Figure 3B:
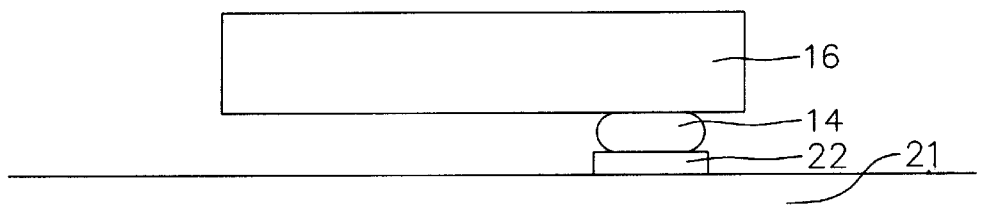

Then, as shown in FIG. 2D or FIG. 3A, the press bonded ball 4' is press bonded with the lead 8 to form a bump 14, thereby connecting the electrode 5 of the semiconductor element 6 with the lead 8 through the bump 14. The connection is then resin sealed to complete the semiconductor device. The connection of the semiconductor element utilizing the bump is also not limited to a lead, and as shown in FIG. 3B, for example, it may be a type wherein the semiconductor element 16 with the bump 14 is connected with the electrode of a wiring board 21 or the like through the bump 14, or another type. Thus, the side connected to, through the bump, may also be a lead, electrode or the like.

Figure 4:
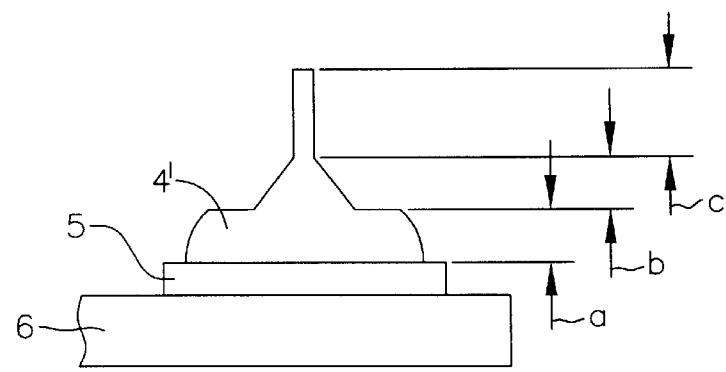
FIG. 4 is a magnified view of a bump.

FIG. 4 shows a magnified view of a press bonded ball from which the gold wire has been cut, as in FIG. 2C. The height a is the height of the press bond from the lower outside of the capillary 1, the height b is the height of the press bond from the inside base of the capillary, and the height c is the wire tail section. The heights a and b have low variation, but the height c has a tendency to vary. A large variation in the height c results in more variation in the size of the bump, while an excessively long height c can result in shorts with adjacent bumps due to the protruding wire ends, when forming the press bonded ball 4' as shown in FIG. 2D. It is therefore necessary to minimize such variation in the height c. In addition, in contrast to the conventional film thickness of about 1 $\mu$m for the semiconductor element Al electrode 5, press bonding to thin electrode films of 0.5 $\mu$m or smaller, 0.3 $\mu$m or smaller, and even 0.1 $\mu$m or smaller is now being demanded. When balls are press bonded to such ultrathin electrode films, breakage of the electrodes, and consequent breakage of the chips, tends to occur.

When a bump is formed using a gold wire according to the invention, the tail length variation is minimal and chip cracks can be prevented even when press bonding ultrathin electrode films, and therefore it is preferably used for semiconductor devices in which the semiconductor element electrode and lead are connected through a gold bump and the connection is sealed with a resin, and wherein the semiconductor element Al electrode film thicknesses are 0.5 $\mu$m and smaller.

EXAMPLES

Test A

After adding prescribed amounts of the elements listed in Table 1 to high purity gold with a purity of 99.999 wt % and melting the mixture in a vacuum fusion furnace, it was cast to obtain gold alloy ingots with compositions A1 to A11 shown in Table 1; these were subjected to cold working with a groove roll and wire drawing machine and then intermediate annealing with the final cold working giving a diameter of 25 μm, and after final annealing to an elongation of 4% the surface was coated with a lubricant and each gold alloy wire was finished and measured.

A roundness test was conducted first. A model UTC-200 high-speed automatic bonder (product of Shinkawa Co., Ltd.) was used first to form a ball at the tip of the gold alloy wire with an arc discharge using an electric torch. The current and time for the arc discharge conditions were adjusted to form two types of balls, one with a diameter of 55 μm (conventional ball of 2.2 times the wire diameter) and one with a diameter of 45 μm (minute ball of 1.8 times the wire diameter). Next, each of the balls was thermocompression bonded by combined ultrasonic-thermocompression bonding onto a semiconductor element Al electrode at a die temperature of 200° C. using a press bonding tool.

The roundness of the conventional ball and minute ball was measured before and after press bonding. The diameters of the balls before press bonding were measured in an arbitrary normal direction, and the minor diameter/major diameter ratio was taken as the roundness. The roundness after press bonding was determined by separately measuring the press bonded diameter in the direction normal to the direction of ultrasonic wave application (hereunder referred to as X) and the press bonded diameter in the direction parallel thereto (hereunder referred to as Y), and taking the X/Y ratio as the press bonded roundness of the minute ball. The average values of the roundness for 50 balls each are shown in Table 1.

A chip damage test was then conducted. Using an SBB-1 bump bonder (product of Shinkawa Co., Ltd.), a ball was formed in the same manner at the tip of the gold alloy wire with an arc discharge using an electric torch. The size of the ball was equivalent to a conventional ball (55 μm diameter). Next, the ball was thermocompression bonded by combined ultrasonic-thermocompression bonding onto a semiconductor element Al electrode at a die temperature of 200° C. using a press bonding tool. The semiconductor element Al electrode used had a normal thickness (1 μm) or a microthickness (0.1 μm). For the thermocompression bonding conditions, the ultrasonic output was at 4 levels in the range of 0.5–1.5 W and the load was at 3 levels in the range of 0.4–0.8 N, for a total of 12 fabricated types, and 400 bumps were tested under each condition; the samples with no chip cracking under any of the conditions were judged as satisfactory while those with chip cracking under any one condition were judged as unsatisfactory. In the measuring results in Table 1, satisfactory samples were designated by "◯", and unsatisfactory samples by "x".

A tail length uniformity test was conducted next. Thermocompression bonding was carried out in the same manner as the second test except that the normal film thickness (1 μm) was used for the Al electrode. Next, the gold alloy wire 2 was pulled upward in the area shown in FIG. 2C, to form a bump 4'. The heights a, b and c were measured as in FIG. 3 which shows a magnified view of the bump. Fifty bumps were measured with a metallogy microscope for each set of conditions, and the difference between the maximum and minimum values was taken as the tail length uniformity and listed in Table 1.

The breaking load was then measured by a tensile test at room temperature. The results are shown in Table 1.

Experimental Examples

The gold alloy wires of diameter 25 μm for Experimental Examples 1–45 were finished and measured in the same manner as Test Example A, except that the compositions were as shown in Tables 2 and 3.

For the press bonded roundness test for the minute balls, the roundness of each of the press bonded balls was measured in the same manner as Test A (Roundness test), except that minute balls (45 μm diameter) were formed, and the results are shown in Tables 2 and 3.

The breaking load was determined by a tensile test on a sample material, and the results are shown in Tables 2 and 3.

For the chip damage test, the chip damage was measured in the same manner as Test A (Chip damage test), except that a minute film thickness (0.1 μm) was used as the film thickness for the semiconductor element Al electrode; the results are shown in Tables 2 and 3.

For the tail length uniformity test, the tail length uniformity was measured in the same manner as Test A (Tail length uniformity test), except that a minute film thickness (0.1 μm) was used as the film thickness for the semiconductor element Al electrode; the results are shown in Tables 2 and 3.

Test Results

Test A

Test A, for investigation of the elements necessary to achieve the object of the invention, was conducted using the compositions shown in Table 1 (Samples A1 to A11).

(1) Roundness Test

The following conclusions may be drawn from the measurements of the press bonded minute balls.

[1] The roundness of the press bonded minute balls was insufficient at less than 0.94 with sample A7 which contained no Ca among Ca, Gd and Y, samples A3, A4 and A11 which contained no Gd, samples A5, A6 and A10 which contained no Y and samples A8 and A9 which contained 0.5% of Ag or Co.

[2] Samples A3 to A11 had satisfactory ball roundness of 0.97 or greater before press bonding or after press bonding of conventional-sized balls, but they had insufficient roundness after press bonding of minute balls.

[3] Sample A1 which contained 20 ppm by weight each of Ca, Gd and Y had satisfactory roundness of 0.97 after press bonding of minute balls.

[4] Sample A2 which containing 20 ppm by weight of Eu as a first group element in addition to the composition of sample A1 had even more satisfactory roundness of 1.00 after press bonding of minute balls.

(2) Chip Damage Test

The following conclusion may be drawn from measurement of the chip cracking of 0.1 μm thickness minute electrodes.

[1] Samples A8 and A9 which contained 0.5% of Ag or Co exhibited chip cracking.

This demonstrated an upper limit to the amount of added elements.

(3) Tail Length Variation

The following conclusions may be drawn from measurement of the tail length variation.

[1] Sample A7 which contained no Ca among Ca, Gd and Y, samples A3, A4 and A11 which contained no Gd and samples A5, A6 and A10 which contained no Y had unsatisfactory tail length variation of 56 μm or greater.

[2] Sample A1 which contained 20 ppm by weight each of Ca, Gd and Y had satisfactory tail length variation of 40 μm.

[3] Sample A2 which contained 20 ppm by weight of Eu as the first group element in addition to the composition of sample A1 had even more satisfactory tail length variation of 19 μm.

(4) Breaking Load

[1] Samples A1, A2, A8 and A9 which contained 20 ppm by weight of at least Ca, Gd or Y had satisfactory breaking loads of 139–140 mN.

[2] Sample A7 which contained no Ca but contained 20 ppm by weight each of Gd and Y and sample A10 which contained both Be and Gd had low breaking loads of 124–127 mN.

(5) Conclusion

For the parameters of roundness after minute ball press bonding, chip damage and tail length variation, excellent effects were obtained when Eu was included in addition to Ca, Gd and Y, with greater amounts among these resulting in smaller effects in terms of roundness after minute ball press bonding and chip damage.

Experimental Examples 1–45

In order to achieve the object of the present invention, Experiment Examples 1–45 were conducted using the compositions listed in Tables 2 and 3, as follow-up experiments to Test A.

(1) Test I (Test A and Experimental Examples 1–7)

The following conclusions may be drawn from Test I according to Table 2 in which the Ca addition amount was varied.

[1] In the copresence of Gd and Y, an excellent effect toward the object of the invention was exhibited with a Ca addition amount in the range of 5–100 ppm by weight. Specifically, the roundness after minute ball press bonding was 0.96–0.97, the breaking load was 133–145 mN, no chip damage was found, and the tail length variation was 31–48 μm.

[2] With a Ca addition amount of less than 5 ppm by weight, the roundness after minute ball press bonding was 0.93, the breaking load was 127 mN and the tail length variation was 78 μm, all of which were unsatisfactory.

[3] A Ca addition amount exceeding 100 ppm by weight was also unsatisfactory, since the roundness after minute ball press bonding was 0.91 and chip damage was produced.

[4] When Eu was added in addition to Ca, Gd and Y, an even more excellent effect toward the object of the invention was exhibited with a Ca addition amount in the range of 5–100 ppm by weight. That is, the roundness after minute ball press bonding was 0.99–1.00 and the tail length variation was 13–27 μm, which was an even more excellent result.

(2) Test II (Test A and Experimental Examples 8–13)

The following conclusions may be drawn from Test II according to Table 2 in which the Gd addition amount was varied.

[1] In the copresence of Ca and Y, an excellent effect toward the object of the invention was exhibited with a Gd addition amount in the range of 5–100 ppm by weight. Specifically, the roundness after minute ball press bonding was 0.95–0.97, the breaking load was 138–140 mN, no chip damage was found, and the tail length variation was 33–45 μm.

[2] With a Gd addition amount of less than 5 ppm by weight, the roundness after minute ball press bonding was 0.92 and the tail length variation was 75 μm, which were both unsatisfactory.

[3] A Gd addition amount exceeding 100 ppm by weight was also unsatisfactory, since the roundness after minute ball press bonding was 0.90 and chip damage was produced.

[4] When Eu was added in addition to Ca, Gd and Y, an even more excellent effect toward the object of the invention was exhibited with a Gd addition amount in the range of 5–100 ppm by weight. That is, the roundness after minute ball press bonding was 0.99–1.00 and the tail length variation was 15–29 μm, which was an even more excellent result.

(3) Test III (Test A and Experimental Examples 14–19)

The following conclusions may be drawn from Test III according to Table 2 in which the Y addition amount was varied.

[1] In the copresence of Ca and Gd, an excellent effect toward the object of the invention was exhibited with a Y addition amount in the range of 1–100 ppm by weight. Specifically, the roundness after minute ball press bonding was 0.95–0.97, the breaking load was 137–142 mN, no chip damage was found, and the tail length variation was 35–50 μm.

[2] With a Y addition amount of less than 5 ppm by weight, the roundness after minute ball press bonding was 0.93 and the tail length variation was 82 μm, which were both unsatisfactory.

[3] A Y addition amount exceeding 100 ppm by weight was also unsatisfactory, since the roundness after minute ball press bonding was 0.91 and chip damage was produced.

[4] When Eu was added in addition to Ca, Gd and Y, an even more excellent effect toward the object of the invention was exhibited with a Y addition amount in the range of 1–100 ppm by weight. That is, the roundness after minute ball press bonding was 0.98–1.00 and the tail length variation was 16–29 μm, which was an even more excellent result.

(4) Test IV (Test A and Experimental Examples 20–31)

The following conclusions may be drawn from Test IV according to Table 3 in which the addition amount of the first group element (rare earth element other than Gd or Y) was varied.

[1] In the copresence of Ca, Gd and Y, the most excellent effect toward the object of the invention was exhibited by Experimental Examples 20–30 and sample A2, with a first group element addition amount in the range of 1–100 ppm by weight. Specifically, it exhibited a particularly excellent roundness after minute ball press bonding of 0.98–1.00, a breaking load of 136–141 mN, no chip damage and a tail length variation of from 15 to 29 μm.

[2] Experimental Example 31, which had a first group element addition amount exceeding 100 ppm by weight, was unsatisfactory since the roundness after minute ball press bonding was 0.91 and chip damage was produced.

(5) Test V (Test A and Experimental Examples 32–45)

The following conclusions may be drawn from Test V according to Table 3 in which the addition amount of the second group element (Mg, Ti or Pb) was varied.

[1] In the copresence of Ca, Gd, Y and the first group element, the most excellent effect toward the object of the invention was exhibited by Experimental Examples 32–42, which had at least one second group element addition amount in the range of 1–100 ppm by weight, as in Test IV. Specifically, it exhibited particularly excellent roundness after minute ball press bonding of 0.98–1.00, a breaking load of 137–141 mN, no chip damage and a tail length variation of from 9 to 18 μm.

[2] Experimental Example 43, which had a total addition amount exceeding 200 ppm by weight, was unsatisfactory since the roundness after minute ball contact bonding was 0.96 and chip damage was produced.

[3] Experimental Examples 44 and 45, which contained prescribed amounts of the second group elements but contained no Gd or Y among Ca, Gd, Y and first group elements, had a roundness after minute ball press bonding of 0.91–0.92 and a tail length variation of from 37–43 μm. Of those with prescribed amounts of the second group elements added, Experimental Examples 32–42 which contained Ca, Gd, Y and the first group element exhibited more excellent results.

TABLE 1

|  | Composition | | | | | | | | Test results | | | | | | | |
|---|---|---|---|---|---|---|---|---|---|---|---|---|---|---|---|---|
|  | | | | | | | | | Break- | Elong- | Roundness test | | | | Chip damage test | | Tail length varia- tion (μm) |
|  | | | | | | | | | | | Conventional ball (55 μm diameter) | | Minute ball (45 μm diameter) | | Conven- tional film thick- ness (1 μm) | Minute film thick- ness (0.1 μm) | |
|  | Weight % | | Weight ppm | | | | | | ing load (nM) | ation (%) | Before contact bonding | After contact bonding | Before contact bonding | After contact bonding | | | |
|  | Ag | Co | Ca | Be | Gd | Y | Eu | Au | | | | | | | | | |
| Test | | | | | | | | | | | | | | | | | |
| A1 |  |  | 20 |  | 20 | 20 |  | remainder | 140 | 4 | 1.00 | 0.98 | 0.98 | 0.97 | ○ | ○ | 40 |
| A2 |  |  | 20 |  | 20 | 20 | 20 | remainder | 139 | 4 | 1.00 | 0.99 | 1.00 | 1.00 | ○ | ○ | 19 |
| A3 |  |  | 20 |  |  | 20 |  | remainder | 134 | 4 | 1.00 | 0.99 | 0.98 | 0.92 | ○ | ○ | 75 |
| A4 |  |  | 20 |  |  | 20 | 20 | remainder | 132 | 4 | 0.99 | 0.98 | 0.97 | 0.91 | ○ | ○ | 57 |
| A5 |  |  | 20 |  | 20 |  |  | remainder | 133 | 4 | 1.00 | 0.97 | 0.98 | 0.93 | ○ | ○ | 82 |
| A6 |  |  | 20 |  | 20 |  | 20 | remainder | 134 | 4 | 0.99 | 0.96 | 0.98 | 0.94 | ○ | ○ | 56 |
| A7 |  |  |  |  | 20 | 20 |  | remainder | 127 | 4 | 0.99 | 0.94 | 0.98 | 0.93 | ○ | ○ | 78 |
| A8 | 0.5 |  | 20 |  | 20 | 20 |  | remainder | 140 | 4 | 0.99 | 0.90 | 0.96 | 0.90 | ○ | x | 26 |
| A9 |  | 0.5 | 20 |  | 20 | 20 |  | remainder | 140 | 4 | 0.99 | 0.90 | 0.95 | 0.89 | ○ | x | 32 |
| A10 |  |  | 20 | 10 | 20 |  |  | remainder | 124 | 4 | 1.00 | 0.98 | 0.97 | 0.94 | ○ | ○ | 60 |
| A11 |  |  | 20 | 10 |  | 20 |  | remainder | 135 | 4 | 1.00 | 0.97 | 0.98 | 0.91 | ○ | ○ | 65 |

TABLE 2

| | | Composition (weight ppm) | | | | | | | | | | | | Test results | | | | |
|---|---|---|---|---|---|---|---|---|---|---|---|---|---|---|---|---|---|---|
| | | Added elements | | | | | | | | | | | | Roundness | | | | Tail |
| | | First elements group | | | | | | | | Second element group | | | | Au & un- avoidable impurities | * Eval- ua- tion | after min- ute ball contact bonding | Break- ing load (mN) | Chip dam- age | length varia- tion (μm) |
| | | Ca | Gd | Y | Eu | La | Ce | Lu | Subtotal | Mg | Ti | Pb | Total | | | | | | |
| Test I | Test A7 | — | 20 | 20 | — | — | — | — | 40 | — | — | — | 40 | remainder | x | 0.93 | 127 | ○ | 78 |
| | Exp. Ex. 1 | 5 | 20 | 20 | — | — | — | — | 45 | — | — | — | 45 | remainder | Δ | 0.96 | 133 | ○ | 48 |
| | Test A1 | 20 | 20 | 20 | — | — | — | — | 60 | — | — | — | 60 | remainder | Δ | 0.97 | 140 | ○ | 40 |
| | Exp. Ex. 2 | 100 | 20 | 20 | — | — | — | — | 140 | — | — | — | 140 | remainder | Δ | 0.96 | 145 | ○ | 31 |
| | Exp. Ex. 3 | 150 | 20 | 20 | — | — | — | — | 190 | — | — | — | 190 | remainder | x | 0.91 | 150 | x | 25 |
| | Exp. Ex. 4 | — | 20 | 20 | 20 | — | — | — | 60 | — | — | — | 60 | remainder | x | 0.94 | 125 | ○ | 54 |
| | Exp. Ex. 5 | 5 | 20 | 20 | 20 | — | — | — | 65 | — | — | — | 65 | remainder | ○ | 0.99 | 136 | ○ | 27 |
| | Test A2 | 20 | 20 | 20 | 20 | — | — | — | 80 | — | — | — | 80 | remainder | ○ | 1.00 | 139 | ○ | 19 |
| | Exp. Ex. 6 | 100 | 20 | 20 | 20 | — | — | — | 160 | — | — | — | 160 | remainder | ○ | 0.99 | 146 | ○ | 13 |
| | Exp. Ex. 7 | 150 | 20 | 20 | 20 | — | — | — | 210 | — | — | — | 210 | remainder | x | 0.93 | 149 | x | 10 |
| Test II | Test A3 | 20 | — | 20 | — | — | — | — | 40 | — | — | — | 40 | remainder | x | 0.92 | 134 | ○ | 75 |
| | Exp. Ex. 8 | 20 | 5 | 20 | — | — | — | — | 45 | — | — | — | 45 | remainder | Δ | 0.95 | 138 | ○ | 45 |
| | Test A1 | 20 | 20 | 20 | — | — | — | — | 60 | — | — | — | 60 | remainder | Δ | 0.97 | 140 | ○ | 40 |
| | Exp. Ex. 9 | 20 | 100 | 20 | — | — | — | — | 140 | — | — | — | 140 | remainder | Δ | 0.96 | 140 | ○ | 33 |
| | Exp. Ex. 10 | 20 | 150 | 20 | — | — | — | — | 190 | — | — | — | 190 | remainder | x | 0.90 | 139 | x | 30 |
| | Test A4 | 20 | — | 20 | 20 | — | — | — | 60 | — | — | — | 60 | remainder | x | 0.91 | 132 | ○ | 57 |
| | Exp. Ex. 11 | 20 | 5 | 20 | 20 | — | — | — | 65 | — | — | — | 65 | remainder | ○ | 1.00 | 138 | ○ | 29 |
| | Test A2 | 20 | 20 | 20 | 20 | — | — | — | 80 | — | — | — | 80 | remainder | ○ | 1.00 | 139 | ○ | 19 |
| | Exp. Ex. 12 | 20 | 100 | 20 | 20 | — | — | — | 160 | — | — | — | 160 | remainder | ○ | 0.99 | 139 | ○ | 15 |
| | Exp. Ex. 13 | 20 | 150 | 20 | 20 | — | — | — | 210 | — | — | — | 210 | remainder | x | 0.93 | 132 | x | 13 |
| Test III | Test A5 | 20 | 20 | — | — | — | — | — | 40 | — | — | — | 40 | remainder | x | 0.93 | 133 | ○ | 82 |
| | Exp. Ex. 14 | 20 | 20 | 1 | — | — | — | — | 41 | — | — | — | 41 | remainder | Δ | 0.95 | 137 | ○ | 50 |
| | Test A1 | 20 | 20 | 20 | — | — | — | — | 60 | — | — | — | 60 | remainder | Δ | 0.97 | 140 | ○ | 40 |
| | Exp. Ex. 15 | 20 | 20 | 100 | — | — | — | — | 140 | — | — | — | 140 | remainder | Δ | 0.95 | 142 | ○ | 35 |
| | Exp. Ex. 16 | 20 | 20 | 150 | — | — | — | — | 190 | — | — | — | 190 | remainder | x | 0.91 | 143 | x | 32 |
| | Test A6 | 20 | 20 | — | 20 | — | — | — | 60 | — | — | — | 60 | remainder | x | 0.94 | 134 | ○ | 56 |
| | Exp. Ex. 17 | 20 | 20 | 1 | 20 | — | — | — | 61 | — | — | — | 61 | remainder | ○ | 0.98 | 138 | ○ | 29 |
| | Test A2 | 20 | 20 | 20 | 20 | — | — | — | 80 | — | — | — | 80 | remainder | ○ | 1.00 | 139 | ○ | 19 |
| | Exp. Ex. 18 | 20 | 20 | 100 | 20 | — | — | — | 160 | — | — | — | 160 | remainder | ○ | 0.99 | 141 | ○ | 16 |

TABLE 2-continued

| | | Composition (weight ppm) | | | | | | | | | | | | Test results | | | |
|---|---|---|---|---|---|---|---|---|---|---|---|---|---|---|---|---|---|
| | | Added elements | | | | | | | | | | | | Roundness | | | Tail |
| | | First elements group | | | | | | | | Second element group | | | Au & un-avoidable impurities | *Eval-ua-tion | after min-ute ball contact bonding | Break-ing load (mN) | Chip dam-age | length varia-tion (μm) |
| | | Ca | Gd | Y | Eu | La | Ce | Lu | Subtotal | Mg | Ti | Pb | Total | | | | | |
| Exp. Ex. 19 | | 20 | 20 | 150 | 20 | — | — | — | 20 | — | — | — | 210 | remainder | x | 0.91 | 141 | x | 15 |

TABLE 3

| | | Composition (weight ppm) | | | | | | | | | | | | Test results | | | |
|---|---|---|---|---|---|---|---|---|---|---|---|---|---|---|---|---|---|
| | | Added elements | | | | | | | | | | | | Roundness | | | Tail |
| | | First element group | | | | | | | Sub-total | Second element group | | | Au & un-avoidable impurities | *Eval-ua-tion | after min-ute ball contact bonding | Break-ing load (mN) | Chip dam-age | length varia-tion (μm) |
| | | Ca | Gd | Y | Eu | La | Ce | Lu | | Mg | Ti | Pb | Total | | | | | |
| Test IV | Test A1 | 20 | 20 | 20 | — | — | — | — | — | — | — | — | 60 | remainder | Δ | 0.97 | 138 | ○ | 40 |
| | Exp. Ex. 20 | 20 | 20 | 20 | 1 | — | — | — | 1 | — | — | — | 61 | remainder | ○ | 0.98 | 140 | ○ | 27 |
| | Test A2 | 20 | 20 | 20 | 20 | — | — | — | 20 | — | — | — | 80 | remainder | ○ | 1.00 | 139 | ○ | 19 |
| | Exp. Ex. 21 | 20 | 20 | 20 | 100 | — | — | — | 100 | — | — | — | 160 | remainder | ○ | 0.99 | 137 | ○ | 13 |
| | Exp. Ex. 22 | 20 | 20 | 20 | — | 1 | — | — | 1 | — | — | — | 61 | remainder | ○ | 0.99 | 138 | ○ | 29 |
| | Exp. Ex. 23 | 20 | 20 | 20 | — | 20 | — | — | 20 | — | — | — | 80 | remainder | ○ | 1.00 | 141 | ○ | 24 |
| | Exp. Ex. 24 | 20 | 20 | 20 | — | 100 | — | — | 100 | — | — | — | 160 | remainder | ○ | 0.99 | 140 | ○ | 20 |
| | Exp. Ex. 25 | 20 | 20 | 20 | — | — | 20 | — | 20 | — | — | — | 80 | remainder | ○ | 0.99 | 138 | ○ | 26 |
| | Exp. Ex. 26 | 20 | 20 | 20 | — | — | — | 20 | 20 | — | — | — | 80 | remainder | ○ | 0.98 | 141 | ○ | 27 |
| | Exp. Ex. 27 | 22 | 10 | 10 | 1 | 1 | — | — | 2 | — | — | — | 42 | remainder | ○ | 0.99 | 136 | ○ | 28 |
| | Exp. Ex. 28 | 20 | 20 | 10 | 1 | 1 | — | — | 2 | — | — | — | 52 | remainder | ○ | 0.99 | 137 | ○ | 25 |
| | Exp. Ex. 29 | 20 | 40 | 40 | 40 | 40 | — | — | 100 | — | — | — | 180 | remainder | ○ | 1.00 | 138 | ○ | 18 |
| | Exp. Ex. 30 | 20 | 50 | 50 | 20 | 20 | 20 | 20 | 80 | — | — | — | 200 | remainder | ○ | 0.99 | 141 | ○ | 15 |
| | Exp. Ex. 31 | 20 | 20 | 20 | 150 | — | — | — | 150 | — | — | — | 210 | remainder | x | 0.91 | 135 | x | 26 |
| Test V | Test A2 | 20 | 20 | 20 | 20 | — | — | — | 20 | — | — | — | 80 | remainder | ○ | 1.00 | 140 | ○ | 19 |
| | Exp. Ex. 32 | 20 | 20 | 20 | 20 | — | — | — | 20 | 1 | — | — | 81 | remainder | ○ | 0.99 | 139 | ○ | 17 |
| | Exp. Ex. 33 | 20 | 20 | 20 | 20 | — | — | — | 20 | 20 | — | — | 100 | remainder | ○ | 0.98 | 141 | ○ | 14 |
| | Exp. Ex. 34 | 20 | 20 | 20 | 20 | — | — | — | 20 | 100 | — | — | 180 | remainder | ○ | 0.99 | 140 | ○ | 9 |
| | Exp. Ex. 35 | 20 | 20 | 20 | 20 | — | — | — | 20 | — | 1 | — | 81 | remainder | ○ | 0.99 | 140 | ○ | 18 |
| | Exp. Ex. 36 | 20 | 20 | 20 | 20 | — | — | — | 20 | — | 20 | — | 100 | remainder | ○ | 1.00 | 140 | ○ | 15 |
| | Exp. Ex. 37 | 20 | 20 | 20 | 20 | — | — | — | 20 | — | 100 | — | 180 | remainder | ○ | 0.99 | 141 | ○ | 12 |
| | Exp. Ex. 38 | 20 | 20 | 20 | 20 | — | — | — | 20 | — | — | — | 81 | remainder | ○ | 0.99 | 139 | ○ | 18 |
| | Exp. Ex. 39 | 20 | 20 | 20 | 20 | — | — | — | 20 | — | — | 2 | 100 | remainder | ○ | 0.99 | 137 | ○ | 14 |
| | Exp. Ex. 40 | 20 | 20 | 20 | 20 | — | — | — | 20 | — | — | 10 | 180 | remainder | ○ | 0.98 | 138 | ○ | 13 |
| | Exp. Ex. 41 | 20 | 20 | 20 | 20 | — | — | — | 20 | 20 | 20 | — | 120 | remainder | ○ | 0.99 | 140 | ○ | 13 |
| | Exp. Ex. 42 | 20 | 20 | 20 | 20 | — | — | — | 20 | 20 | 20 | 2 | 140 | remainder | ○ | 0.98 | 139 | ○ | 10 |
| | Exp. Ex. 43 | 20 | 20 | 20 | 20 | — | — | — | 20 | 50 | 50 | 3 | 210 | remainder | x | 0.96 | 140 | x | 25 |
| | Exp. Ex. 44 | 20 | — | 20 | 10 | — | — | — | 10 | 20 | — | — | 70 | remainder | x | 0.92 | 132 | ○ | 37 |
| | Exp. Ex. 45 | 20 | 20 | — | 10 | — | — | — | 10 | 20 | — | — | 70 | remainder | x | 0.91 | 134 | ○ | 43 |

What is claimed is:

1. A gold wire for semiconductor element connection consisting of 5–100 ppm by weight of Ca, 5–100 ppm by weight of Gd and 1–100 ppm by weight of Y, the total amount of these elements being no greater than 200 ppm by weight, the balance being gold and unavoidable impurities.

2. A gold wire for semiconductor element connection consisting of 5–100 ppm by weight of Ca, 5–100 ppm by weight of Gd, 5–100 ppm by weight of Y, and 1–100 ppm by weight selected from at least one of Eu, La, Ce, and Lu, the total amount of these elements being no greater than 200 ppm by weight, the balance being gold and unavoidable impurities.

3. The gold wire for semiconductor element connection according to claim 2, which further consists of 1–100 ppm by weight of at least one Mg and Ti, the total amount of the added elements being no greater than 200 ppm by weight.

4. A semiconductor element connection method which comprises:

(A) a step of inserting a gold wire into a capillary, and heating and melting the tip of the gold wire to form a gold ball;

(B) a step of lowering the capillary and pressing the gold ball against an electrode of the semiconductor element to bond the gold wire to the electrode;

(C) a step of tracing a prescribed path with the capillary including said gold wire bonded to the electrode, to move it over a member to be connected and to establish a press bond between the side of the gold wire and the member to be connected; and (D) a step of raising the gold wire which has been press bonded to the connection member while clamping it with a clamper to cut the gold wire, to complete wiring of the gold wire between the semiconductor element electrode and the connection member, wherein said gold wire is a gold wire according to any one of the claims 1, 2 and 3.

5. The method of claim 4, wherein at least one of step (A) and step (C) further includes transmitting ultrasonic vibrations through the capillary to the gold wire tip while heating the semiconductor element or connection member with a heater block for thermocompression bonding of said gold ball.

6. The method of claim 4, wherein the pitch of the adjacent electrodes on the semiconductor element is no greater than 70 μm.

7. The method of claim 4, wherein the pitch of the adjacent electrodes on the semiconductor element is no greater than 60 μm.

8. A semiconductor element connection method which comprises:

(A) a step of inserting a gold wire into a capillary, and heating and melting the tip of the gold wire to form a gold ball;

(B) a step of lowering the capillary and pressing the gold ball against an electrode of the semiconductor element to form a press bonded gold ball; and (C) a step of raising said gold wire which has the formed press bonded gold ball on the semiconductor element electrode while clamping it with a clamper to cut the gold wire near the base of the press bonded gold ball, to form a bump on the electrode, wherein said gold wire is a gold wire according to any of the claims 1, 3 and 4.

9. The method of claim 8, which further comprises a step of press bonding the bump formed on the semiconductor element electrode to a member to be connected.

10. The method of claim 8, wherein step (A) further includes transmitting ultrasonic vibrations through the capillary to the gold wire tip while heating the semiconductor element with a heater block for the thermocompression bonding of said gold ball.

11. The method of claim 8, wherein said semiconductor element electrode is an aluminum electrode film with a film thickness of no greater than 0.5 μm.

12. The method of claim 8, wherein said semiconductor element electrode is an aluminum electrode film with a film thickness of no greater than 0.1 μm.

* * * * *

UNITED STATES PATENT AND TRADEMARK OFFICE
CERTIFICATE OF CORRECTION

PATENT NO. : 6,492,593 B2
DATED : December 10, 2002
INVENTOR(S) : Hiroshi Murai et al.

It is certified that error appears in the above-identified patent and that said Letters Patent is hereby corrected as shown below:

<u>Title page,</u>
Item [57], ABSTRACT,
Line 1, replace "having" with -- consisting of --.
Line 4, replace "has" with -- consists of --.
Line 6, replace "Ti. The" with -- Ti, the --.
Line 7, replace "weight. The" with -- weight, the --.

<u>Column 13,</u>
Line 66, replace "one Mg" with -- one of Mg --.

Signed and Sealed this

Twenty-seventh Day of April, 2004

JON W. DUDAS
*Acting Director of the United States Patent and Trademark Office*